(12) United States Patent
Miao et al.

(10) Patent No.: US 10,741,557 B2
(45) Date of Patent: Aug. 11, 2020

(54) HYBRID HIGH MOBILITY CHANNEL TRANSISTORS

(71) Applicant: International Business Machines Corporation, Armonk, NY (US)

(72) Inventors: Xin Miao, Guilderland, NY (US); Chen Zhang, Albany, NY (US); Kangguo Cheng, Schenectady, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 15/985,864

(22) Filed: May 22, 2018

(65) Prior Publication Data
US 2019/0363083 A1    Nov. 28, 2019

(51) Int. Cl.
*H01L 27/092* (2006.01)
*H01L 21/8238* (2006.01)
(Continued)

(52) U.S. Cl.
CPC ...... *H01L 27/0924* (2013.01); *H01L 21/8258* (2013.01); *H01L 21/823807* (2013.01); *H01L 21/823821* (2013.01); *H01L 21/845* (2013.01); *H01L 29/1054* (2013.01); *H01L 29/66795* (2013.01); *H01L 29/66818* (2013.01)

(58) Field of Classification Search
CPC ............. H01L 29/66795; H01L 29/785; H01L 21/823821; H01L 27/0924; H01L 21/823431; H01L 21/02532; H01L 29/1054; H01L 29/161; H01L 27/1211; H01L 27/0886; H01L 21/845; H01L 29/66818; H01L 29/165; H01L 21/02381; H01L 29/20

USPC ............... 438/142, 157, 163, 197, 283, 478; 257/331, 369, E21.09, E21.421
See application file for complete search history.

(56) References Cited

U.S. PATENT DOCUMENTS 6,563,143 B2    5/2003    Gao et al.
7,282,425 B2    10/2007    Koester et al.
(Continued)

OTHER PUBLICATIONS

K. D. Choquette et al., "Advances in selective wet oxidation of AlGaAs alloys," IEEE Journal of Selected Topics in Quantum Electronics, vol. 3, No. 3, 1997, 916-926.
(Continued)

*Primary Examiner* — David Chen
(74) *Attorney, Agent, or Firm* — Patterson + Sheridan, LLP

(57) ABSTRACT

A method and structure for forming hybrid high mobility channel transistors. The method includes: providing a substrate, epitaxially growing a buffer layer over the substrate and a semiconductor layer over the buffer layer, forming a partial opening over the semiconductor layer, epitaxially growing a second semiconductor layer in the opening, forming a first plurality of fins from the first semiconductor layer and a second plurality of fins from the second semiconductor layer, where the first semiconductor layer and the second semiconductor material comprise different materials, oxidizing a portion of the second plurality of fins, and stripping the oxidized portion of the second plurality of fins, where after striping the oxidized portion of the second plurality of fins, the second plurality of fins have the same width as the first plurality of fins.

10 Claims, 6 Drawing Sheets

(51) Int. Cl.
  *H01L 21/8258* (2006.01)
  *H01L 29/66* (2006.01)
  *H01L 29/10* (2006.01)
  *H01L 21/84* (2006.01)

(56) References Cited

U.S. PATENT DOCUMENTS

| | | |
|---|---|---|
| 8,486,770 B1 | 7/2013 | Wu et al. |
| 8,610,172 B2 | 12/2013 | Guo et al. |
| 8,859,389 B2 | 10/2014 | Kawasaki et al. |
| 9,299,706 B1 | 3/2016 | Jagannathan et al. |
| 9,337,196 B2 | 5/2016 | Cheng et al. |
| 9,768,075 B1* | 9/2017 | Bergendahl ...... H01L 21/823807 |
| 2013/0230953 A1* | 9/2013 | Sudo .................... H01L 29/785 438/268 |
| 2017/0053915 A1 | 2/2017 | Ando et al. |
| 2017/0288056 A1* | 10/2017 | Balakrishnan ...... H01L 29/7827 |
| 2018/0247938 A1* | 8/2018 | Cheng ................ H01L 27/0924 |

OTHER PUBLICATIONS

S. Takagi et al., "Device and Integration Technologies of III-V/Ge Channel CMOS," ECS Transactions, vol. 41, No. 7, 2011, pp. 203-218.

\* cited by examiner

US 10,741,557 B2

HYBRID HIGH MOBILITY CHANNEL TRANSISTORS

BACKGROUND

The present application relates to semiconductor technology, and more particularly to a method and structure for forming hybrid high mobility channel transistors.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, silicon fin field effect transistors (FinFETs) is the next step in the evolution of complementary metal oxide semiconductor (CMOS) devices. Silicon fin field effect transistors (FETs) can achieve higher drive currents with increasingly smaller dimensions as compared to conventional planar FETs. In order to extend these devices for multiple technology nodes such as, for example, 10 nm and beyond, there is a need to boost the performance with high-mobility channels.

SUMMARY

According to one embodiment of the present disclosure a method of forming a semiconductor structure is provided. The method includes: providing a substrate, epitaxially growing a buffer layer over the substrate, epitaxially growing a semiconductor layer over the buffer layer, recessing the semiconductor layer to form a partial opening over the semiconductor layer, epitaxially growing a second semiconductor layer in the partial opening, forming a first plurality of fins from the first semiconductor layer and a second plurality of fins from the second semiconductor layer, wherein the first semiconductor layer and the second semiconductor layer include different materials, oxidizing a portion of the second plurality of fins, and stripping the oxidized portion of the second plurality of fins, where, after fin formation and prior to oxidation, the second plurality of fins are wider than first plurality of fins, and after striping the oxidized portion of the second plurality of fins, the second plurality of fins have the same width as the first plurality of fins.

According to another embodiment of the present disclosure, a semiconductor structure is provided. The semiconductor structure includes: a substrate, a buffer layer over the substrate, a first type of plurality fins over a semiconductor layer, and a second type of plurality of fins over the semiconductor layer, where the first type of plurality of fins is a same material type as the semiconductor layer, and where the second type of plurality of fins is a different material as the first type of plurality of fins, and where the first type of plurality of fins and the second type of plurality of fins are a same width.

According to another embodiment of the present disclosure, a semiconductor structure is provided. The semiconductor structure includes: a substrate, a buffer layer over the substrate, a first type of plurality fins over a semiconductor layer, and a second type of plurality of fins over the semiconductor layer, where the first type of plurality of fins is a same material type as the semiconductor layer, where the second type of plurality of fins is a different material as the first type of plurality of fins, and where the second type of plurality of fins is an oxidized plurality of fins.

DETAILED DESCRIPTION

Figure 1:
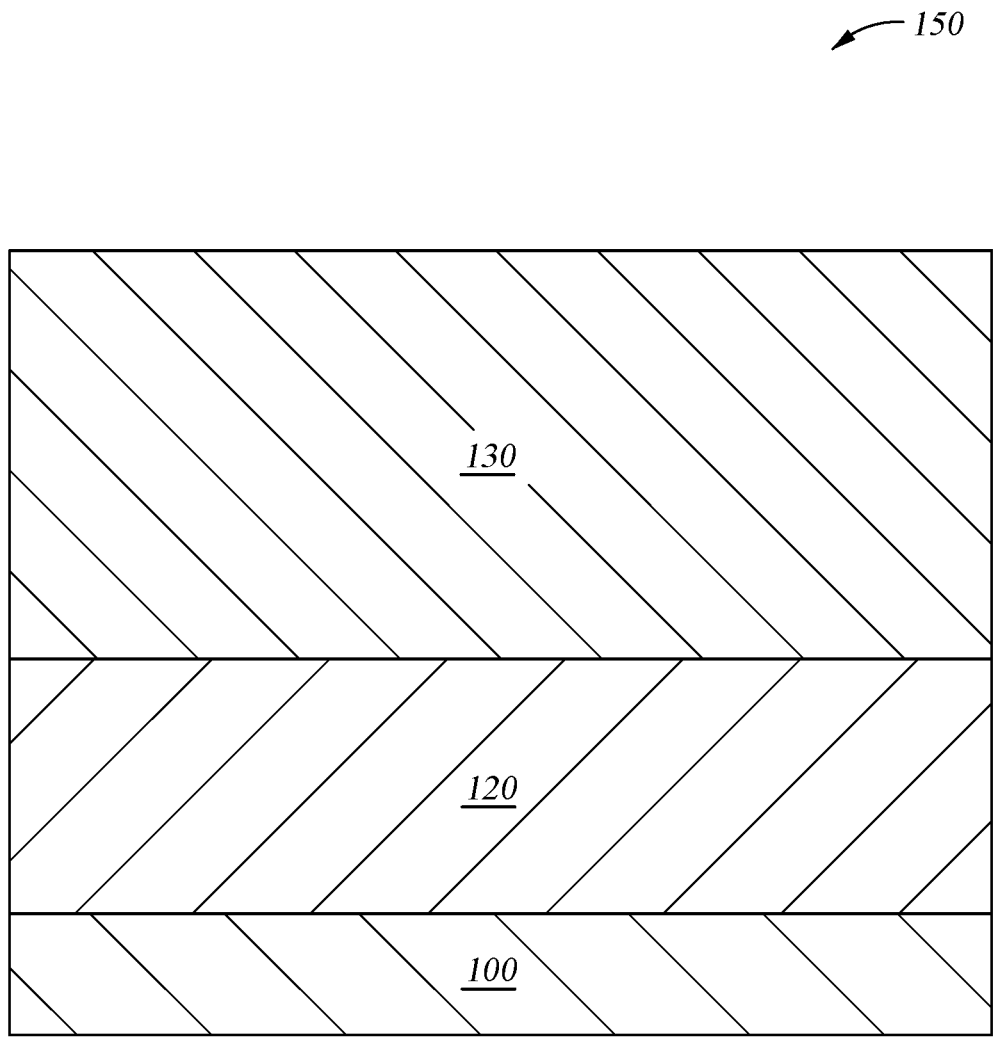
FIG. 1 illustrates a semiconductor structure that includes a substrate and a buffer layer and is useful in accordance with at least one embodiment of the present disclosure.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In an epitaxial growth process, the chemical reactants provided by the source gases are controlled and the system parameters are set so that the reactive molecules arrive at the deposition surface of the semiconductor substrate with sufficient energy to move around on the surface and orient themselves to the crystal arrangement of the atoms of the deposition surface, which results in a lattice matched (epitaxially matched) relationship. Therefore, an epitaxial semiconductor material has the same crystalline characteristics as the deposition surface on which it is formed. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

FIG. 1 illustrates a base semiconductor structure 150, which includes a base substrate 100, a buffer layer 120, and a semiconductor layer 130. The base substrate 100 can be a bulk substrate, e.g. bulk silicon or bulk III-V material, or it can be XOI (X on insulator) structure, e.g. SOI (silicon on insulator), III-V-OI (III-V on insulator), GeOI (germanium-on-insulator) substrate, a silicon-on-insulator (SOI), or a SiGe-on-insulator (SGOI) and may include an insulator layer there-over (not shown), e.g. buried oxide, such as silicon dioxide ($SiO_2$), or semi-insulating III-V material, e.g. indium aluminum arsenic (InAlAs). The base substrate 100, the buffer layer 110, and the semiconductor layer can include any one or more suitable type II, type IV, or type III-V materials, including but not limited to silicon (Si), germanium (Ge), indium phosphide (InP), indium aluminum arsenide (InAlAs), indium gallium arsenide (InGaAs), gallium arsenide (GaAs), gallium phosphide (GaP), gallium phosphide arsenide (GaPAs), indium antimonide (InSb), indium arsenide (InAs), indium nitride (InN), indium phosphide (InP), aluminum gallium arsenide (AlGaAs), indium gallium phosphide (InGaP), aluminum indium arsenide (AlInAs), aluminum indium antimonide (AlInSb), gallium arsenide nitride (GaAsN), and combinations thereof. The application of at least some of the foregoing exemplary materials can result in a germanium-on-insulator (GeOI) substrate, a silicon-on-insulator (SOI) substrate, or a SiGe-on-insulator (SGOI) substrate. In one embodiment, the base substrate 100 is epitaxially matched to the buffer layer 120, which is in turn epitaxially matched to the semiconductor layer 130, and the buffer layer 120 is epitaxially grown over the base substrate 100, and the semiconductor layer 130 is epitaxially grown over the buffer layer 120. In one embodiment, where the layers 100, 120, and 130 are epitaxially matched, both the buffer layer 120 and the semiconductor layer 130 are III-V material layers; where in one embodiment, the buffer layer 120 is a GaPAs layer and the semiconductor layer 130 is a GaAs layer.

Figure 2:
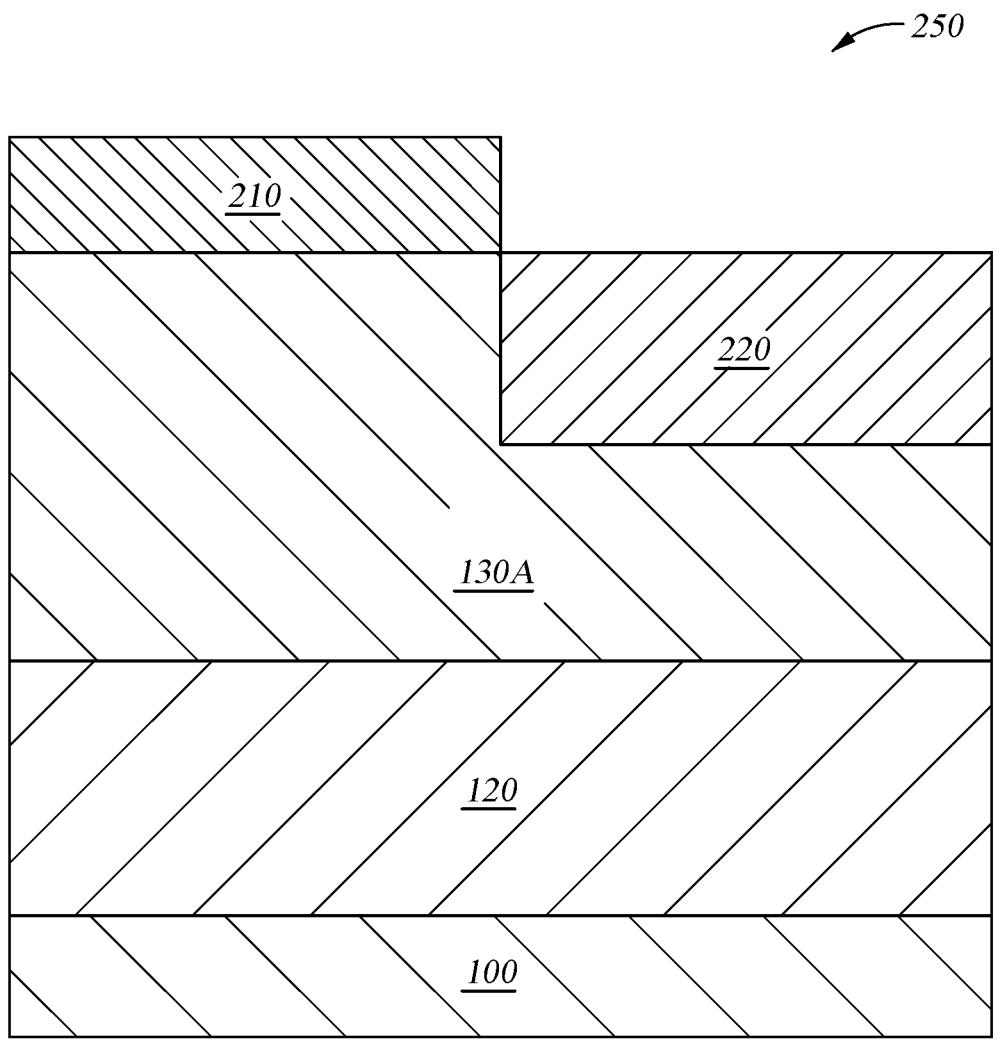
FIG. 2 illustrates a recess and epitaxial growth process in accordance with at least one embodiment of the present disclosure.

FIG. 2 illustrates forming a hardmask over a portion of semiconductor layer 130 and recessing another portion of semiconductor layer 130 in accordance with at least one embodiment of the present disclosure, resulting in structure 250. A hardmask 210 is deposited over a portion of structure 150 that will form a basis for a plurality of fins of an nFET region of a completed semiconductor structure (as discussed below). The hardmask 210 can be deposited using any suitable deposition technique, e.g. CVD, where the hardmask 210 can be a nitride, e.g. silicon nitride, or other suitable hardmask material. In one embodiment, the hardmask 210 can comprise two or more materials. The uncovered portion of semiconductor layer 130 is partially recessed using any suitable technique, e.g. directional etching, where a portion of layer 130, layer 130A, is still over the entirety of the buffer layer 120. Within the opening, and over the recessed portion of semiconductor layer 130A, another semiconductor material 220 is deposited over the recessed portion of the semiconductor layer 130. In one embodiment, the deposited semiconductor material 220 is epitaxially matched to semiconductor layer 130 (and by extension the recessed portion of semiconductor layer 130, i.e. layer 130A), and the deposition is by epitaxial deposition. In one embodiment, the semiconductor layer 130 is a type III-V material and the deposited semiconductor layer 220 is a type IV layer, e.g. a Ge layer, where the type III-V material is selected so that it is epitaxially matched to deposited semiconductor layer 120.

Figure 3:
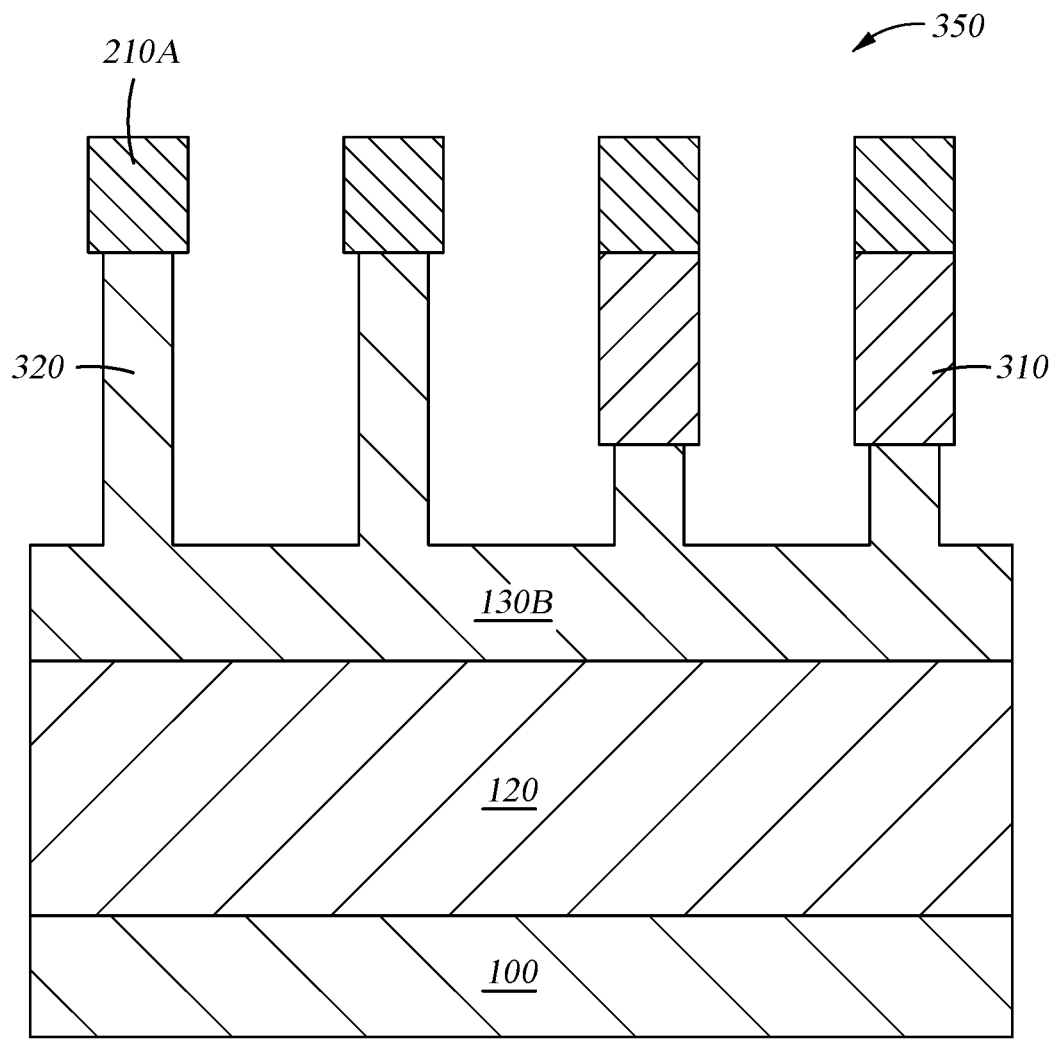
FIG. 3 illustrates a patterning process in accordance with at least one embodiment of the present disclosure.

FIG. 3 illustrates a fin formation process with respect to structure 250, resulting in structure 350. In one embodiment, the hard mask 210 may be removed by using a selective etch process or any other suitable method. In one embodiment, wet etching which has selectivity between the hard mask and the underlying material can be used. Hydrofluoric acid (HF), buffered hydrofluoric acid (BHF) or other materials or combinations of materials may be used to remove the hard mask 210. A dry etch process such as RIE may also be used. In one embodiment, after removal of the hard mask 210, a second hardmask 210A is deposited over both layer 130A and layer 220, and any suitable fin formation technique, e.g. sidewall image transfer, self-aligned double patterning (SADP), self-aligned quadruple patterning (SAQP), lithography followed by etching, or any suitable combination of those techniques, can be applied to form a plurality of fins 320 and a plurality of fins 310. In one embodiment, since the semiconductor layer 130A can be an III-V material, the plurality of fins 320 resulting therefrom can also be an III-V material, and since the semiconductor layer 220 is a type IV material, the plurality of fins 310 resulting therefrom can also be type IV fins. In one embodiment, the materials are selected such that the patterning and etching process associated with a sidewall image transfer will result in the plurality of fins 320, e.g. GaAs fins, being narrower than the plurality of fins 310, e.g. Ge fins. Furthermore, as shown, hard mask 210A will be dispersed into portions over the plurality of fins 310, 320 as a result of the fin formation process. Additionally, as shown, and per one embodiment, the plurality of fins 320 are connected with layer 130B, which is the portion of layer 130A remaining after the fin formation process.

Figure 4:
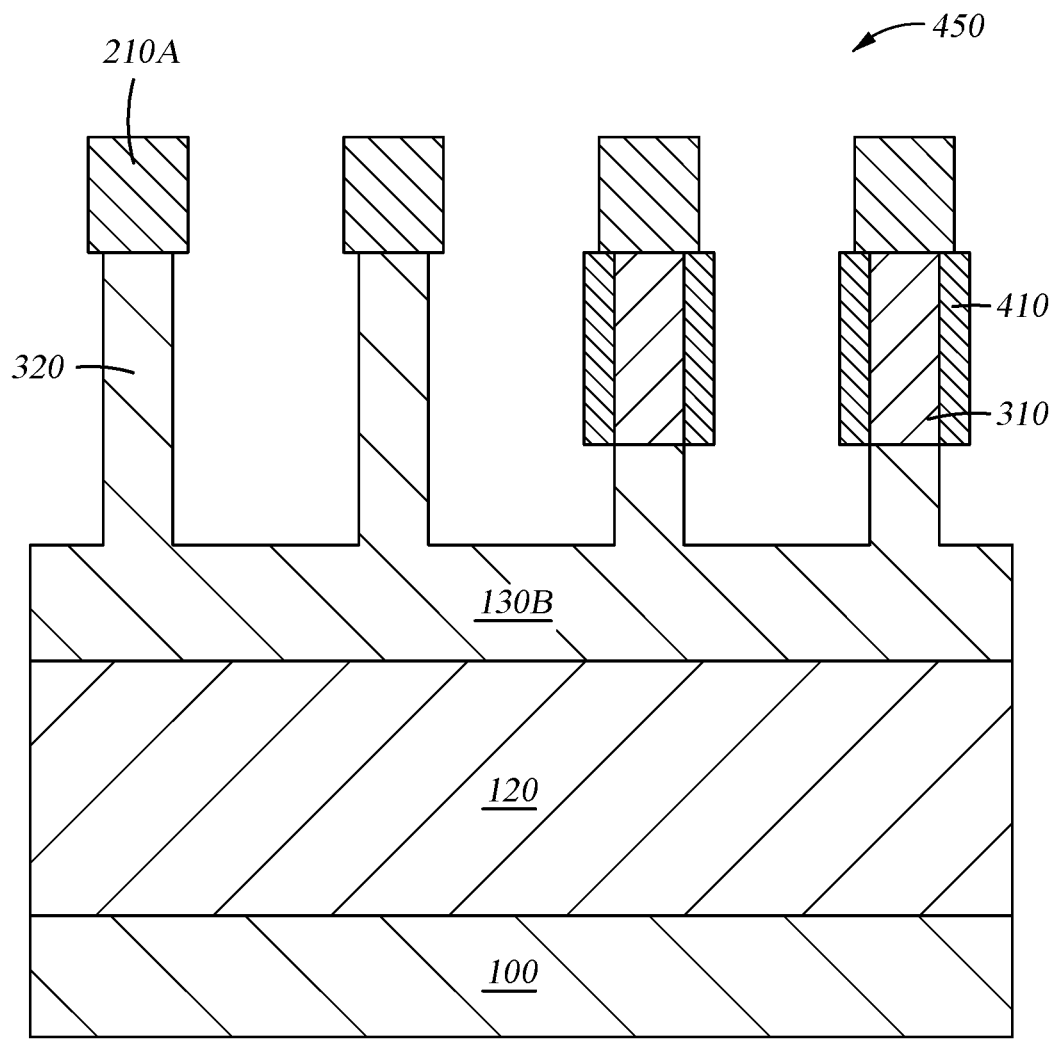
FIG. 4 illustrates an oxidation process in accordance with at least one embodiment of the present disclosure.

FIG. 4 illustrates performing an oxidation process with respect to structure 350, resulting in structure 450. In one embodiment, the plurality of fins 310 can be narrowed to be substantially the same width as the plurality of fins 320 by employing a suitable oxidation step. The oxidation step can be a water vapor oxidation performed at approximately 350 degrees Celsius and selective to the type IV, e.g. Ge, material associated with the plurality of fins 310. A suitable oxide material 410 for a water vapor oxidation is selected such that it removes a greater portion of the type IV, e.g. Ge, fins 310 at a much faster rate than the III-V fins 320, e.g. GaAs fins. As discussed herein, the narrowing of the type IV fins, e.g. Ge fins, 310 enables both fin sets 310, 320 to have substantially the same width, and in one embodiment, since the oxidation of the fins 310 can be achieved without employing another hard mask and one or more etch steps, which offers both a manufacturing, economic, and device-performance advantage in relation to conventional techniques. In one embodiment, oxidation timing ranges from 2 minutes to 60 minutes, where in one embodiment the range is between 10 minutes and 30 minutes.

Figure 5:
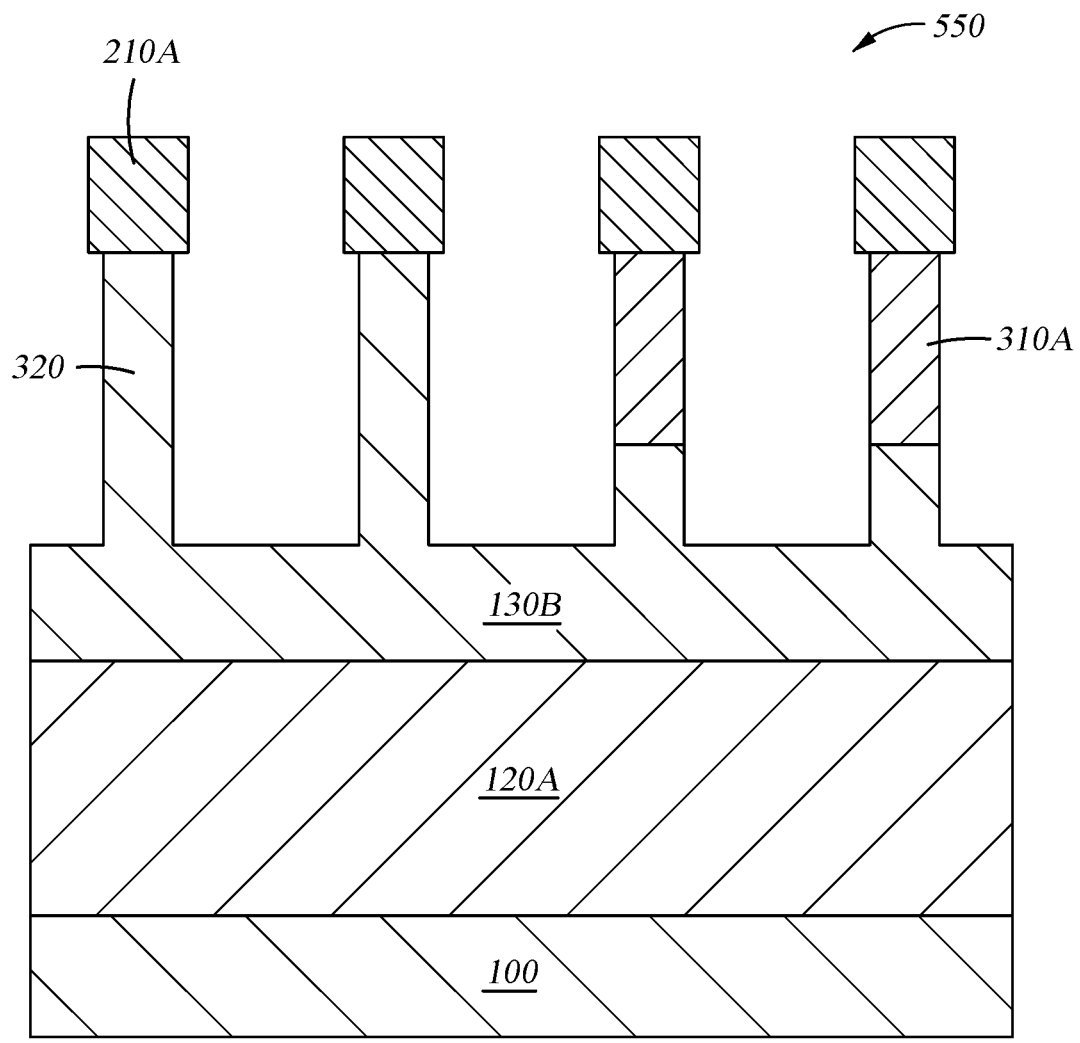
FIG. 5 illustrates a fin dimension adjustment in accordance with at least one embodiment of the present disclosure.

FIG. 5 illustrates an oxide removal process with respect to structure 450, resulting in structure 550. The oxide 410 can be removed using any suitable selective etch technique that removes the oxide 410 without disturbing the rest of structure 450, including but not limited to a suitable wet etch, e.g. hydrofluoric acid (HF) wet etch, or suitable dry etch technique such as chemical oxide removal (COR), or plasma oxide etch. The resulting structure 550 reduces the width of the plurality of fins 310, resulting in a plurality of fins 310A and a plurality of fins 320A with substantially similar widths.

FIG. 5 illustrates an oxide removal process with respect to structure 450, resulting in structure 550. The oxide 410 can be removed using any suitable selective etch technique that removes the oxide 410 without disturbing the rest of structure 450, including but not limited to a suitable wet etch, e.g. hydrofluoric acid (HF) wet etch, or suitable dry etch technique such as chemical oxide removal (COR), or plasma oxide etch. The resulting structure 550 reduces the width of the plurality of fins 320, resulting in a plurality of fins 310 and a plurality of fins 320A with substantially similar widths.

A more detailed account of one type of suitable oxidation scheme, which per one embodiment is modified pursuant to the disclosures made herein, is discussed in greater detail in "Advances in Selective Wet Oxidation of AlGaAs Alloys" by Choquette et al. (IEEE Journal of Selected Topics In Quantum Electronics, Vol. 3 No. 3, June 1997, the entirety of which is incorporated herein by reference.

Figure 6:
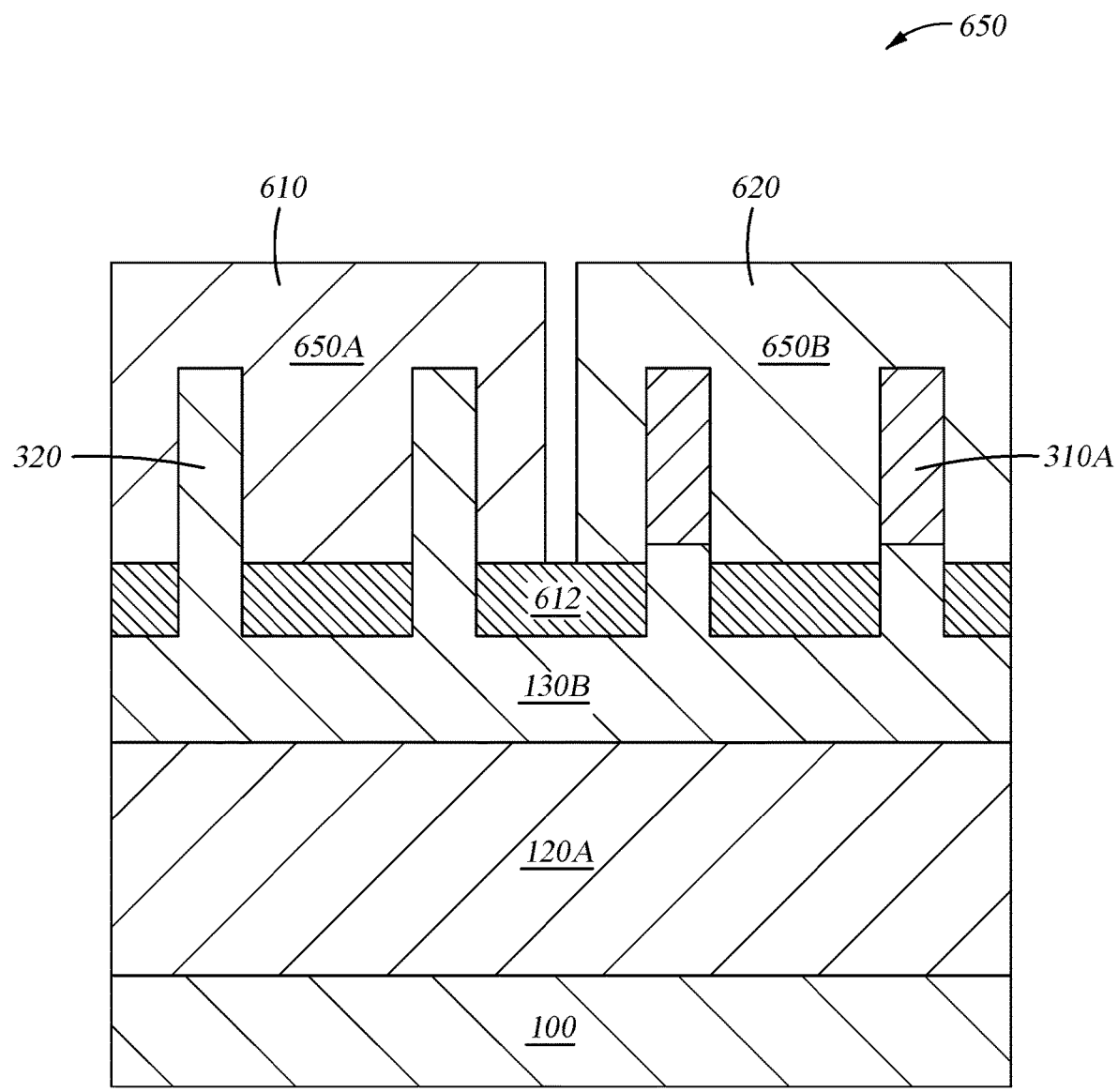
FIG. 6 illustrates a FinFET device in accordance with at least one embodiment of the present disclosure

FIG. 6 illustrates structure a FinFET semiconductor structure 650 resulting from performing one or more semiconductor processing steps to structure 550. In one embodiment, and as above, the hardmask 210A can be removed using any suitable etch process, including wet etching which has selectivity between the hard mask and the underlying layers e.g. hydrofluoric acid (HF), buffered hydrofluoric acid (BHF) or other materials or combinations of materials may be used to remove the hard mask 210A.

In one embodiment, any suitable shallow trench isolation (STI) technique can be employed to form STI regions 612, which will define and electrically isolate individual nFET and pFET transistors (as discussed below). In some embodiments, the isolation region 612 may comprise silicon oxide, silicon nitride, silicon oxynitride, fluoride-doped silicate glass (FSG), a low-K dielectric material, other suitable materials, and/or combinations thereof. The isolation region 612 can be formed by any suitable process. As one example, the formation of the STI may include patterning the layer 130B (and although not shown, any suitable underlying layer) by a conventional photolithography process, etching a trench in the layer 130B (for example, by using a dry etching, wet etching, and/or plasma etching process), and filling the trench (for example, by using a chemical vapor deposition process) with a dielectric material. In one embodiment, although not shown, the filled trench may have a multi-layer structure such as a thermal oxide liner layer filled with silicon nitride or silicon oxide.

In one embodiment, as shown, a metal layer 610 and a metal layer 620 can be formed over the plurality of fins 310A and the plurality of fins 320. The metal layers 610, 620 can be any metal material suitable for forming a metal gate or portion thereof and deposited using any suitable deposition processes, e.g. PCVD, CVD, etc. The metal layers 610 and 620 can include one or more layers including TiN, TaN, TaC, TaSiN, W, TaCN, Al, Ti, WN, TiAl, TiAlN, combinations thereof, and/or other suitable materials. In one embodiment, structure 650A is associated with an nFET region of structure 650 and structure 650B is associated with a pFET region of structure 650; as such, in one embodiment, an n-type work function metal, such as TiAl, TiAlN, or TaCN can be used for layer 610 and a p-type work function metal, such as TiN, WN, or W, may be used for layer 620.

In one embodiment, 610 and 620, each include a gate dielectric and a gate conductor. The gate dielectric can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

The gate conductor can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. In some embodiments, the gate can further include a work function setting layer between the gate dielectric and gate conductor. The work function setting layer can be a work function metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Although not shown, structure 650 can also have side spacers in contact with the relevant transistor devices, e.g. 650A and 650B. Structure 650 can have one or side spacers deposited and in contact with the side of structure 650A, and similarly structure 650 can have one or more side spacers deposited and in contact with the side of structure 650B. The side spacers can be deposited using any suitable deposition technique, e.g. CVD, and can be composed of a silicon nitride (SiN), a silicon oxynitride (SiON), a silicon carbonitride (SiCN), silicon oxycarbonitride (SiOCN), a silicon boronitride (SiBN), a silicon boron carbonitride (SiBCN) or combinations thereof. Additionally, although not expressly shown, and per one embodiment, an inter-layer dielectric material (ILD) is formed over the structure 650, and can include any suitable ILD material, such as, a low-k dielectric material (with k<4.0), including but not limited to, silicon oxide, spin-on-glass, a flowable oxide, a high density plasma oxide, borophosphosilicate glass (BPSG), or any combination thereof. The ILD layer can be deposited by any suitable deposition process, including, but not limited to CVD or PCVD.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A method of forming a semiconductor structure comprising:
   providing a substrate;
   epitaxially growing a buffer layer over the substrate;
   epitaxially growing a first semiconductor layer over the buffer layer;
   recessing the first semiconductor layer to form a partial opening over the first semiconductor layer;
   epitaxially growing a second semiconductor layer in the partial opening;
   forming a first plurality of fins from the first semiconductor layer and a second plurality of fins from the second semiconductor layer, wherein the first semiconductor layer and the second semiconductor layer comprise different materials;
   oxidizing a portion of the second plurality of fins; and
   stripping the oxidized portion of the second plurality of fins,
   wherein, after fin formation and prior to oxidation, the second plurality of fins are wider than the first plurality of fins, and after striping the oxidized portion of the second plurality of fins, the second plurality of fins have the same width as the first plurality of fins.

2. The method of claim 1, wherein the first semiconductor layer comprises a type III-V material, wherein the second semiconductor layer comprises a type IV semiconductor material, wherein the buffer layer comprises a type III-V material, and wherein the first semiconductor layer, the second semiconductor layer, and the buffer layer are lattice matched.

3. The method of claim 1, wherein the first semiconductor layer is a gallium-arsenide (GaAs) layer, wherein the second semiconductor layer is a germanium (Ge) layer, and wherein the buffer layer is a gallium-phosphide-arsenide (GaPAs) layer.

4. The method of claim 1 further comprising:
prior to forming the partial opening, depositing a first hard mask over a portion of the first semiconductor layer;
prior to any fin formation, removing the first hard mask, and after fin formation, depositing a metal layer over at least one of the first plurality of fins and the second plurality of fins;
forming an nFET region with the first plurality of fins; and
forming a pFET region with the second plurality of fins.

5. The method of claim 1, wherein the oxidation of the portion of the second plurality of fins is an oxidation process selective to the second plurality of fins.

6. The method of claim 5, wherein the oxidation process is a water vapor oxidation process.

7. The method of claim 6, wherein the water vapor oxidation process is carried out at approximately 350 degrees Celsius.

8. The method of claim 7, wherein the water vapor oxidation process results in the oxidation of the second plurality of fins and not the first plurality of fins, wherein the first semiconductor layer is a gallium-arsenide (GaAs) layer, and wherein the second semiconductor layer is a germanium (Ge) layer.

9. The method of claim 6, wherein the water vapor oxidation process and stripping of the oxidized portion of the second plurality of fins occur without a hard mask.

10. The method of claim 1 further comprising:
prior to forming the partial opening, depositing a hard mask over a portion of the first semiconductor layer;
forming one or more shallow-trench isolation layers in between each of the first plurality of fins and the second plurality of fins;
forming an nFET region over the first plurality of fins; and
forming a pFET region over the second plurality of fins, wherein the first semiconductor layer is a gallium-arsenide (GaAs) layer, wherein the second semiconductor layer is a germanium (Ge) layer, and wherein the oxidation of the portion of the second plurality of fins is a water vapor oxidation process carried out at 350 degrees Celsius and selective to the second plurality of fins.

* * * * *